United States Patent
Chou et al.

(10) Patent No.: US 9,101,052 B2
(45) Date of Patent: Aug. 4, 2015

(54) SLIDING MECHANISM AND ELECTRONIC APPARATUS HAVING SAME

(71) Applicants: Fu Tai Hua Industry (Shenzhen) Co., Ltd., Shenzhen (CN); Hon Hai Precision Industry Co., Ltd., New Taipei (TW)

(72) Inventors: Che-Yu Chou, New Taipei (TW); Qun Huang, Shenzhen (CN); Tai-Shan Zhu, Shenzhen (CN); Tao Jiang, Shenzhen (CN); Wen-Chih Lan, New Taipei (TW); Jun-Liang Zhang, Shenzhen (CN); Ji-Bing Guo, Shenzhen (CN); Hua-Yong Wang, Shenzhen (CN); Zhi-Jun Shi, Shenzhen (CN); Wei-Wei Yu, Shenzhen (CN); Hai-Qian Ge, Shenzhen (CN); Zhou Chen, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 154 days.

(21) Appl. No.: 14/010,577

(22) Filed: Aug. 27, 2013

(65) Prior Publication Data
US 2014/0092535 A1    Apr. 3, 2014

(30) Foreign Application Priority Data

Sep. 29, 2012  (CN) .......................... 2012 1 0371345.9

(51) Int. Cl.
*H05K 5/02*      (2006.01)
*H02K 33/16*    (2006.01)
*H02K 33/12*    (2006.01)
*H04M 1/02*    (2006.01)
*H01F 7/16*      (2006.01)

(52) U.S. Cl.
CPC ............ *H05K 5/0217* (2013.01); *H01F 7/1646* (2013.01); *H02K 33/12* (2013.01); *H02K 33/16* (2013.01); *H04M 1/0235* (2013.01); *H01F 2007/1692* (2013.01)

(58) Field of Classification Search
CPC ..... G06F 1/1679; E05C 19/166; E05C 17/56; E05C 19/16; H01F 2007/208; H01R 2103/00; H04M 1/0235; G02B 27/0006
USPC ............. 361/832, 818, 679.01; 292/303, 304; 335/298
See application file for complete search history.

(56) References Cited

U.S. PATENT DOCUMENTS

| | | | | |
|---|---|---|---|---|
| 6,151,486 | A  * | 11/2000 | Holshouser et al. | 455/575.3 |
| 6,246,561 | B1 * | 6/2001  | Flynn | 361/147 |
| 6,366,440 | B1 * | 4/2002  | Kung | 361/147 |
| 7,775,567 | B2 * | 8/2010  | Ligtenberg et al. | 292/251.5 |
| 7,889,037 | B2 * | 2/2011  | Cho | 335/306 |
| 8,160,661 | B2 * | 4/2012  | Wang et al. | 455/575.4 |

(Continued)

*Primary Examiner* — Adrian S Wilson
*Assistant Examiner* — Abhishek Rathod
(74) *Attorney, Agent, or Firm* — Novak Druce Connolly Bove + Quigg LLP

(57) ABSTRACT

An electronic apparatus includes a base, a sliding member and a sliding mechanism. The sliding mechanism includes a first magnet disposed in the sliding member, and a first electromagnet disposed in the base opposite to the first magnet. The first magnet and the first electromagnet are capable of producing a first repulsive force and a first attracting force, the sliding member alternately slides back and forth between the different locations of the base driven by the first repulsive force and the first attracting force.

17 Claims, 9 Drawing Sheets

(56) References Cited

U.S. PATENT DOCUMENTS

| | | | |
|---|---|---|---|
| 8,240,858 B2* | 8/2012 | Wang | 359/511 |
| 8,484,809 B2* | 7/2013 | Fiedler | 24/303 |
| 8,705,229 B2* | 4/2014 | Ashcraft et al. | 361/679.27 |
| 2008/0146295 A1* | 6/2008 | Jorgensen et al. | 455/575.3 |
| 2009/0134838 A1* | 5/2009 | Raghuprasad | 320/108 |
| 2009/0146537 A1* | 6/2009 | Wang | 312/334.1 |
| 2009/0147471 A1* | 6/2009 | Francisco et al. | 361/679.56 |
| 2010/0124698 A1* | 5/2010 | Wu et al. | 429/100 |
| 2010/0194503 A1* | 8/2010 | Eromaki | 335/219 |
| 2010/0219709 A1* | 9/2010 | Raghuprasad | 310/156.01 |
| 2012/0177245 A1* | 7/2012 | Shi et al. | 381/398 |
| 2012/0177246 A1* | 7/2012 | Shi et al. | 381/398 |
| 2012/0268902 A1* | 10/2012 | Liang et al. | 361/747 |

* cited by examiner

SLIDING MECHANISM AND ELECTRONIC APPARATUS HAVING SAME

BACKGROUND

1. Technical Field

The present disclosure relates to electronic apparatuses, especially, to a sliding mechanism and an electronic apparatus having the sliding mechanism to drive the electronic apparatus to slide among different locations.

2. Description of Related Art

Many electrical apparatuses are manually operated to switch from one state to another state. For example, usually, a cover may be used to cover power outlets of a power supply socket to prevent dust or other materials from entering into the power outlets. So, when a user needs to use the power supply socket, she or he should manually move the cover away to expose the power outlets. This manual operation is an inconvenience.

Therefore, there is a need for overcoming the limitations described above.

DETAILED DESCRIPTION

FIGS. 1-9 show an electronic apparatus of the present disclosure, and the electronic apparatus includes a base, a sliding member and a sliding mechanism 80. The sliding mechanism 80 drives the sliding member to slide among different locations of the base.

FIGS. 1-6c show that a power supply socket 1 is taken as an example of the electronic apparatus. The power supply socket 1 includes a housing 60, at least one cover 70 and at least one sliding mechanism 80 corresponding to the at least one cover 70, the housing 60 is defined as the base, and the cover 70 is defined as the sliding member. The at least one cover 70 can slide from one location of the housing 60 to another location of the housing 60 driven by the at least one sliding mechanism 80, such as to slide between a first predetermined location of the housing 60 and a second predetermined location of the housing 60.

Figure 1:
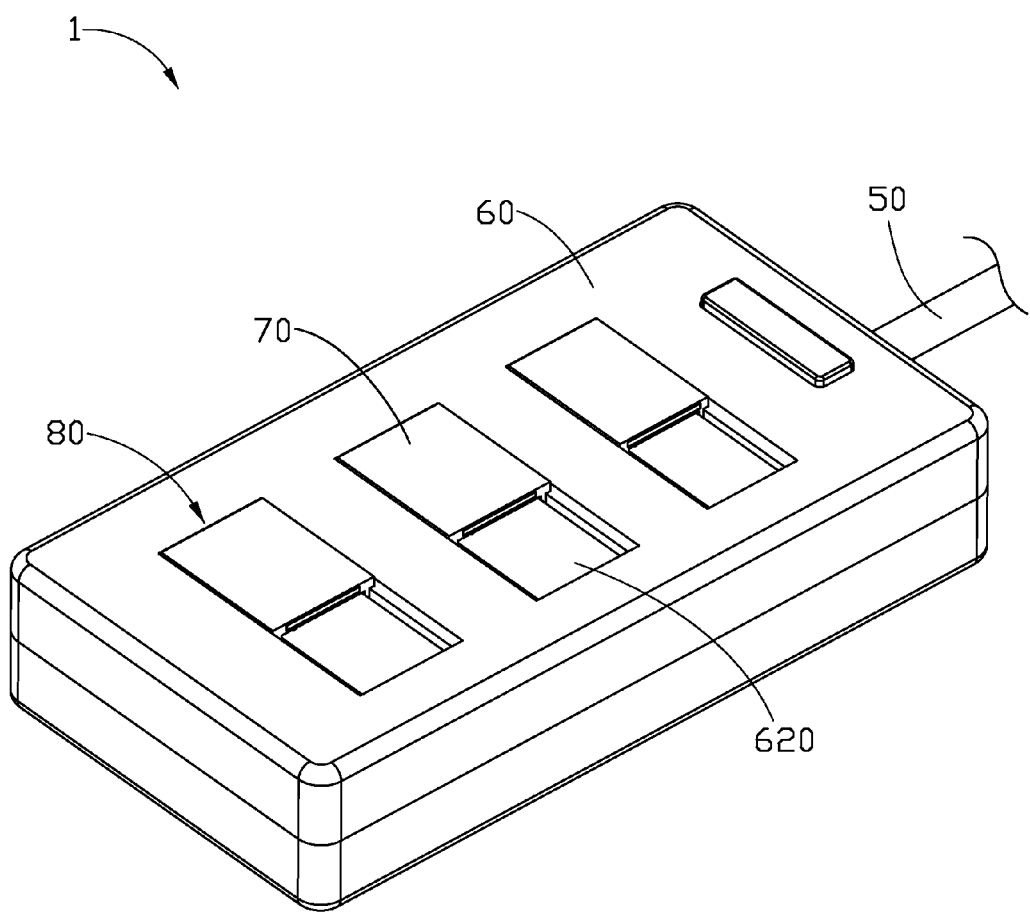
FIG. 1 is an isometric view of an electronic apparatus in a non-working state, according to a first embodiment.
Figure 2:
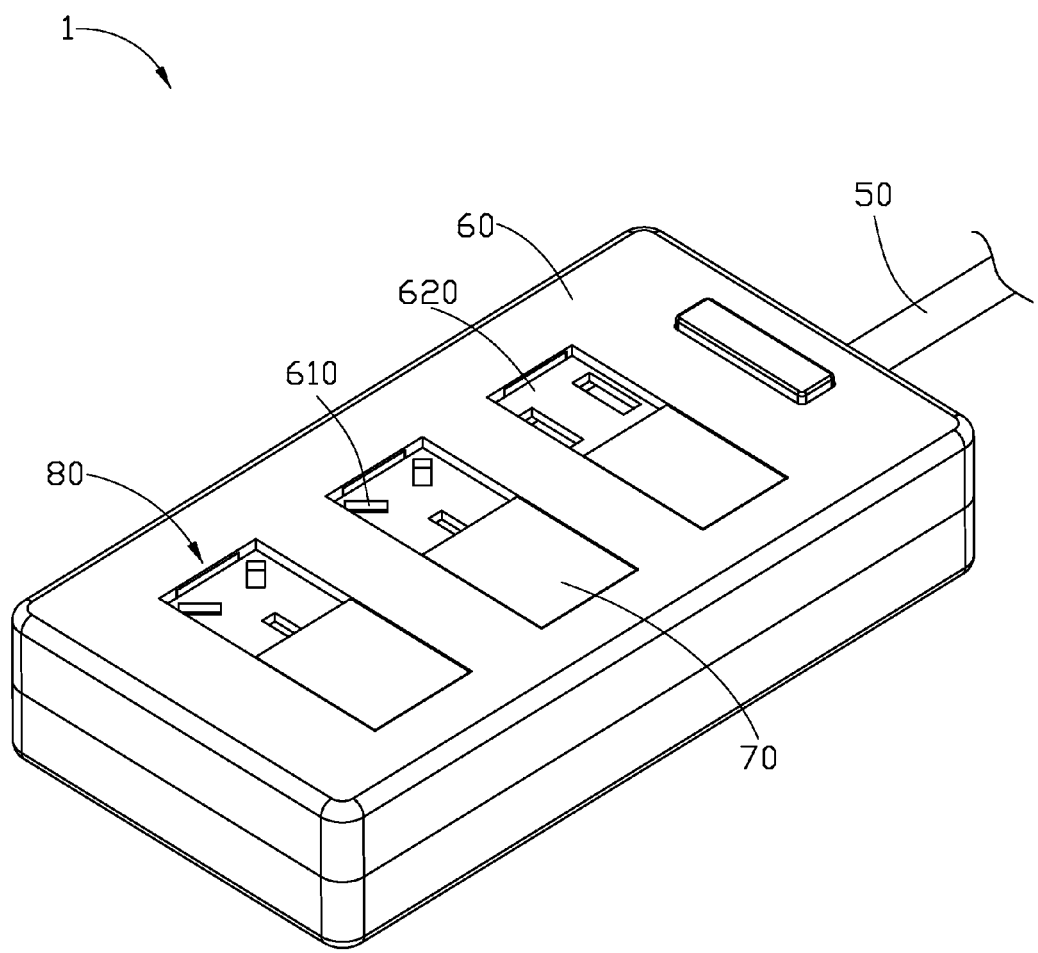
FIG. 2 is an isometric view of the electronic apparatus of FIG. 1 in a working state.

In the embodiment, as shown in FIGS. 1 and 2, the power supply socket 1 includes a power cable 50 extending out of the housing 60 from a side of the housing 60. A plug (not shown) is disposed at one end of the power cable 50 away from the housing 60, to be able to connect with an external power supply. The housing 60 defines at least one receiving room 620 with a pair of power outlets 610 defined at the bottom of each receiving room 620. FIG. 1 shows a non-working state of the power supply socket 1 when each cover 70 is driven by the sliding mechanism 80 to cover a corresponding pair of power outlets 610 to prevent water and dust from entering into the power supply socket 1, thereby avoiding the occurrence of electrical accidents. FIG. 2 shows a working state of the power supply socket 1 when each cover 70 slides away driven by the sliding mechanism 80, to expose the corresponding pair of power outlets 610, to facilitate a user to use.

Figure 3:
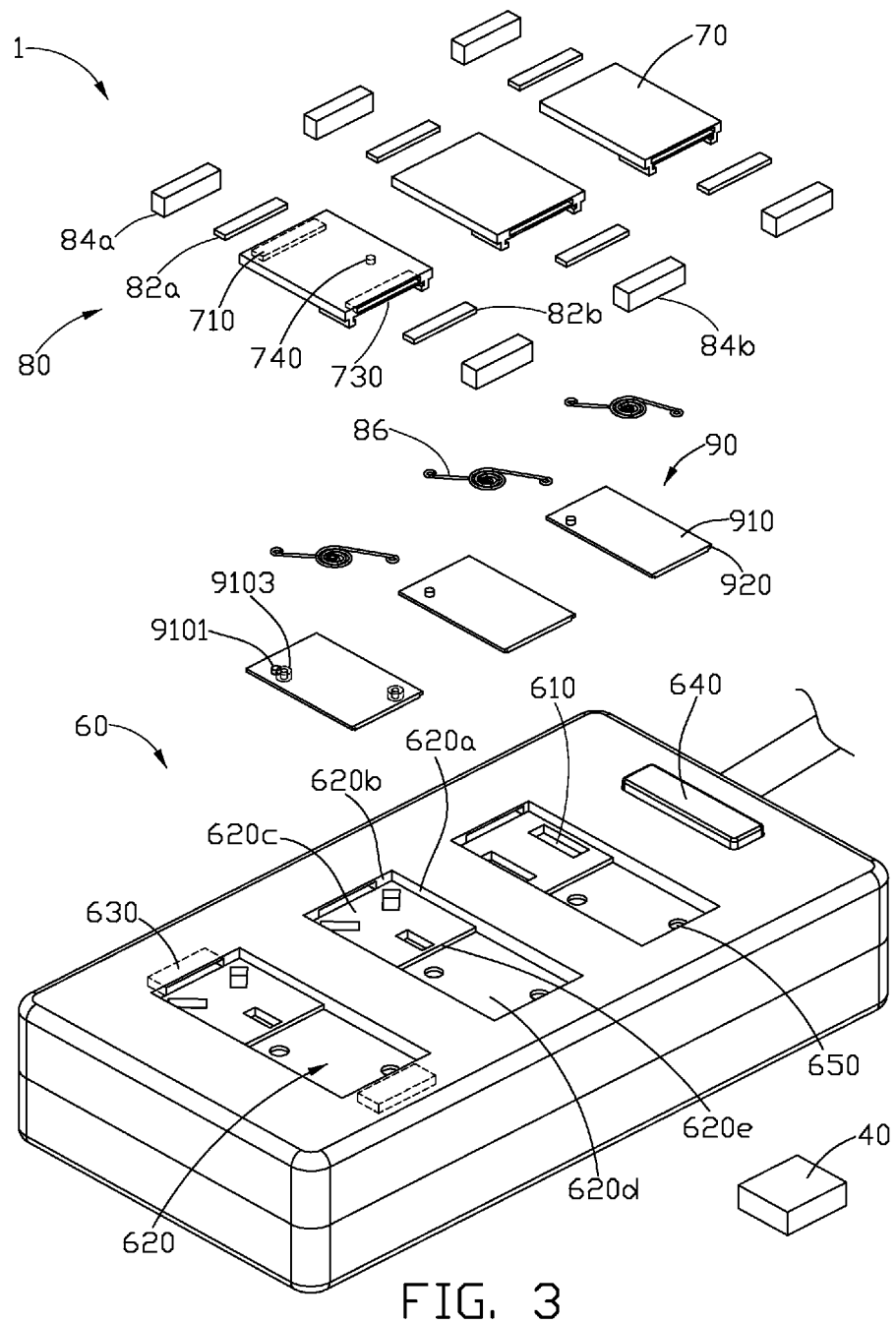
FIG. 3 is an exploded view of the electronic apparatus of FIG. 2.

FIG. 3 shows an exploded view of the power supply socket 1 of FIG. 2. In the embodiment, the housing 60 is rectangular shaped, and defines an internal receiving space (not shown) for receiving electronic components, such as a circuit board. In one embodiment, the at least one receiving room 620 extends downward from a top surface of the housing 60, the number of the receiving rooms 620 is three, and the three receiving rooms 620 have the same dimensions and are arranged along the longitudinal direction of the housing 60. The number of the cover 70 is three corresponding to the three receiving rooms 620. Each receiving room 620 may receive one cover 70 and one sliding mechanism 80 correspondingly, and each cover 70 can slide within a corresponding receiving room 620 between different locations driven by a corresponding sliding mechanism 80, respectively. In other embodiments, the number of the receiving room 620 is one. At least two pairs of power outlets 610 are disposed at the bottom of the receiving room 620 and parallel to each other. The receiving room 620 receives at least two covers 70 and at least two sliding mechanisms 80 corresponding to the at least two pairs of power outlets 610.

Each receiving room 620 is a cuboid shaped hole and includes two opposite first sidewalls 620a, two opposite second sidewalls 620b, and a first room 620c and a second room 620d surrounded by the first sidewalls 620a and the second sidewalls 620b. The two first sidewalls 620a are perpendicular to the longitudinal direction of the housing 60, the two second sidewalls 620b are perpendicular to the two first sidewalls 620a. The second room 620d extends downward from the first room 620c to communicate with the first room 620c with a connecting surface 620e. The connecting surface 620e is disposed in the middle of each receiving room 620, which is parallel to the second sidewalls 620b and communicates with the two first sidewalls 620a. Each pair of power outlets 610 is disposed at the bottom of the first room 620c of one receiving room 620. It is understood that, in other embodiments, the first room 620c and the second room 620d can be arranged on a same plane, and the two first sidewalls 620a may be parallel to or form an angle with the longitudinal direction of the housing 60.

Two receiving grooves 630 are defined in the second sidewalls 620b. In other embodiments, the two receiving grooves 630 can be defined at two opposite bottom ends of each receiving room 620, and parallel to the sliding direction of the cover 70. In the embodiment, each sliding mechanism 80 includes a first electromagnet 84a received in a corresponding receiving groove 630 adjacent to the power outlets 610. A switch 640 is disposed at an exterior surface of the housing 60 adjacent to the receiving rooms 620, which is configured to power on or power off the power supply socket 1 by pressing the switch 640.

In the embodiment, each cover 70 is cube-shaped, and is slidably received in a corresponding receiving room 620. The length of each cover 70 is less than that of the first sidewall 620a of the corresponding receiving room 620. Thus, under driven of the corresponding sliding mechanism 80, the cover 70 is capable of moving along a direction parallel to the first sidewall 620a and can slide back and forth between the first room 620c and the second room 620d in the receiving room 620, to alternatively cover and expose the power outlets 610. Thus, the power supply socket 1 is switched between the non-working state and the working state.

Two sidewalls (not labeled) of each cover 70 defines two cuboid notches 710 corresponding to the two receiving grooves 630. In other embodiments, the two notches 710 are disposed on a bottom surface of each cover 70 relative to the housing 60 when the two receiving grooves 630 are defined at the two opposite bottom ends of the receiving room 620. In this embodiment, each sliding mechanism 80 further includes a first magnet 82a received in a corresponding notch 710 relative to the first electromagnet 84a. Additionally, a sliding groove 730 is defined on the bottom surface of each cover 70, so that the cover 70 can slide stably in the receiving room 620.

Figure 4:
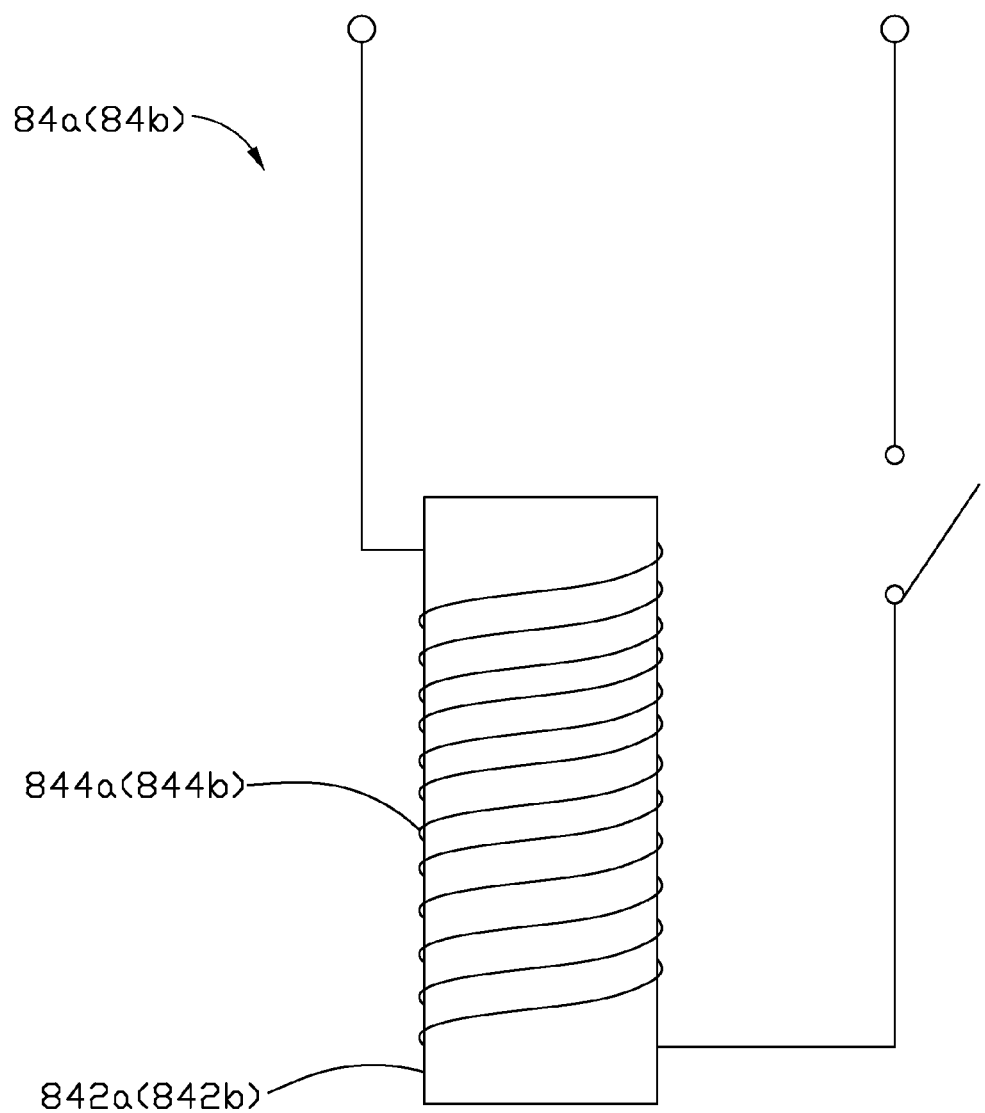
FIG. 4 is a structure diagram of a first or a second electromagnet of FIG. 3.

FIG. 4 shows a structure diagram of the first electromagnet 84a. In the embodiment, the first electromagnet 84a includes a first iron core 842a and a first coil 844a wound around the first iron core 842a. The first iron core 842a is bar-shaped, the first coil 844a is a solenoid, and a permanent magnet is capable of attracting the first iron core 842a. Otherwise, when the first coil 844a is to be energized, a predetermined voltage is applied to the first coil 844a to produce a directional current. The first iron core 842a can be made temporarily magnetic to become a magnet by the first coil 844a and has a corresponding magnetic polarity. Then, a North pole (N pole) and an South pole (S pole) of the first iron core 842a can be determined according to Ampere's Right Hand Rule. When the voltage of the first coil 844a disappears, the first iron core 842a is de-magnetized to be back to an iron and has no magnetism.

The Ampere's Right Hand Rule is that, when holding a solenoid with the right hand of a user, and bending four fingers of the user with the same direction as the current of the solenoid, the direction of the thumb pointing to is a N pole of the solenoid.

Figure 5A:
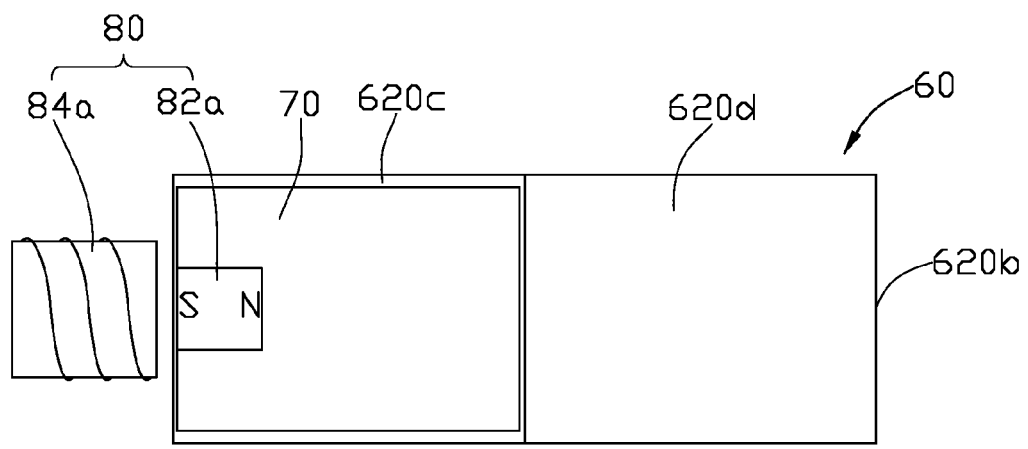
FIGS. 5a-5b are schematic diagrams showing different states of a cover changed under a force of a first magnet and the first electromagnet of FIG. 3.
Figure 5B:
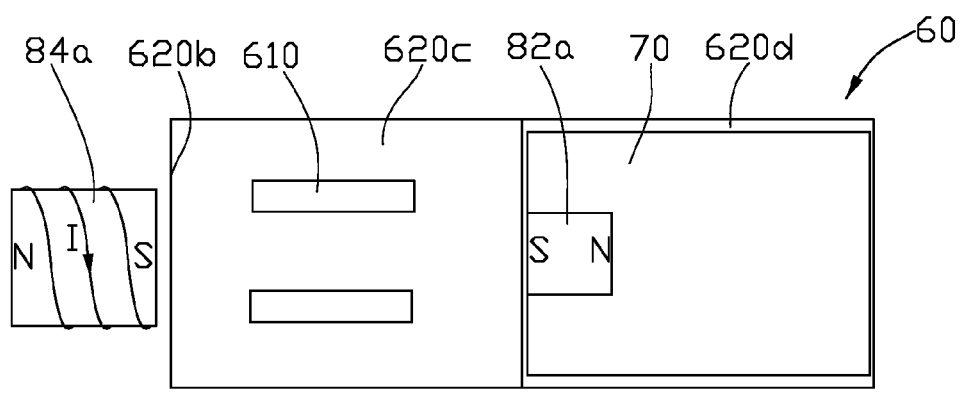

FIGS. 5a-5b show schematic diagrams with different states of the cover 70 changed under a force produced between the first magnet 82a and the first electromagnet 84a. In this embodiment, the first magnet 82a is a permanent magnet. The power supply socket 1 further includes a reserve power source 40 (shown in FIG. 3) to supply power to the first electromagnet 84a when the power supply socket 1 is powered off. FIG. 5a shows an initial state of the power supply socket 1 when the cover 70 covers the power outlets 610. At this time, the first electromagnet 84a is in its initial state having no magnetism, and one end of the first magnet 82a adjacent to the first electromagnet 84a is a S pole, the other end is a N pole. Since an attractive force exists between an iron and a permanent magnet, the first iron core 842a is capable of attracting the first magnet 82a, driving the cover 70 to slide to resist a corresponding second sidewall 620b of the housing 60 adjacent to the first electromagnet 84a. In addition, the cover 70 is latched within the first room 620c of the housing 60, covering the power outlets 610 defined in the first room 620c.

When the switch 640 is pressed to power on the power supply socket 1 to energize the first coil 844a to produce a current I, the first iron core 842a becomes a magnet. According to the Ampere's Right Hand Rule, the first iron core 842a acquires a contrary magnetic polarity with the first magnet 82a, and one end of the magnetized first iron core 842a adjacent to the first magnet 82a is magnetized to be determined as a S pole. The first magnet 82a and the first electromagnet 84a repulse each other and produce a first repulsive force to drive the cover 70 to move away from the first iron core 842a. The cover 70 slides to the state shown in FIG. 5b from the first room 620c to the second room 620d under the first repulsive force, and at this time the location of the housing 60 is defined as the first predetermined location of the housing 60.

FIG. 5b shows the working state of the power supply socket 1 when the cover 70 does not cover the power outlets 610. At this time, the first electromagnet 84a is magnetized, and the end of the first electromagnet 84a adjacent to the first magnet 82a is a S pole. The cover 70 resists another second sidewall 620b and is latched in the second room 620d of the housing 60 under the first repulsive force of the first magnet 82a and the first electromagnet 84a.

Then, when the switch 640 is pressed again to power off the power supply socket 1 to de-energize the first coil 844a, the first iron core 842a is de-magnetized and back to be an iron, the first repulsive force between the first magnet 82a and the first electromagnet 84a disappears, but an attractive force between them is produced which is defined as a first attracting force having an opposite direction with the first repulsive force. With the first attracting force, the cover 70 slides back to the first room 620c from the second room 620d to return to the state of covering the power outlets 610, and the first electromagnet 84a is back to the initial state. Therefore, the power supply socket 1 is back to the initial state shown in FIG. 5a, and at this time the location of the housing 60 is defined as the second predetermined location of the housing 60. At last, the cover 70 slides back and forth relative to the housing 60 between the first predetermined location and the second predetermined location under the first repulsive force and the first attracting force, so as to switch the states of the power supply socket 1 between the non-working state and the working state.

Figure 6A:
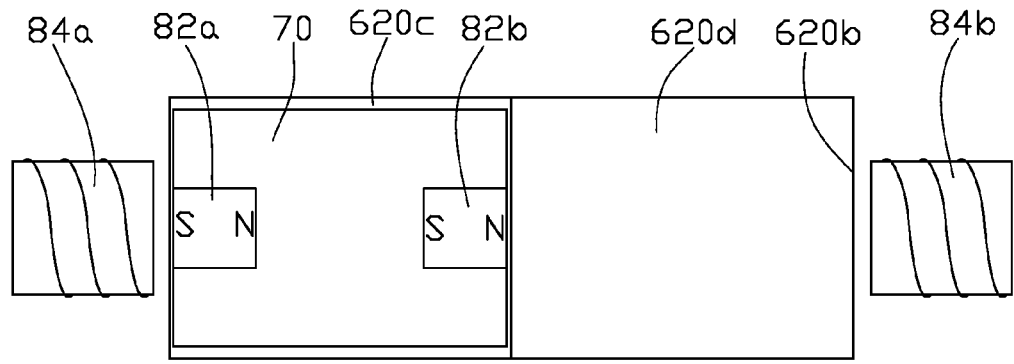
FIGS. 6a-6c are schematic diagrams showing different states of the cover changed under a force of the first and a second magnets and the first and the second electromagnets of FIG. 3.
Figure 6B:
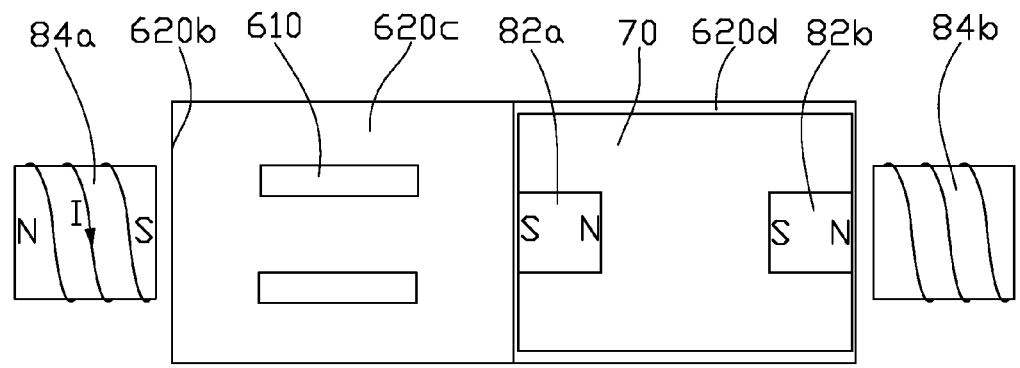
Figure 6C:
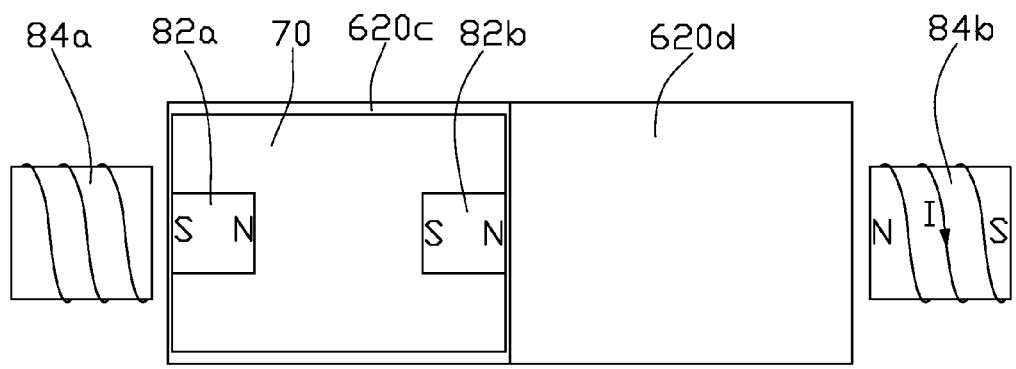

As Shown in FIG. 3 and FIG. 4, in order to drive the cover 70 to slide more quickly relative to the housing 60, each sliding mechanism 80 further includes a second magnet 82b and a second electromagnet 84b. The second electromagnet 84b includes a second iron core 842b and a second coil 844b wound around the second iron core 842b. FIGS. 6a-6c show different states of the cover 70 changed under a force of the first and second magnets 82a, 82b, and the first and second electromagnets 84a, 84b. In the embodiment, the second magnet 82b is a permanent magnet, and the second iron core 842b is an iron. The second magnet 82b and the second electromagnet 84b are disposed respectively in the other notch 710 of the cover 70 and the other receiving groove 630 of the housing 60, and are opposite to each other (shown in FIG. 3). In other embodiments, the notch 710 can be omitted, and the first and the second magnets 82a, 82b are fixed on two opposite sidewalls of the cover 70. Further, in another embodiment, the cover 70 can be a rectangular permanent magnet having a N pole and a S pole, where the N pole and the S pole are used as the first and second magnets 82a and 82b of the sliding mechanism 80, respectively.

FIG. 6a shows an initial state of the power supply socket 1, the difference between the FIG. 5a and FIG. 6a is that the sliding mechanism 80 of FIG. 6a further includes the second magnet 82b and the second electromagnet 84b, the second electromagnet 84b is in an initial state having no magnetism, and the end of the second magnet 82b adjacent to the second electromagnet 84b is a N pole and the other end is a S pole.

When the switch 640 is pressed to power on the power supply socket 1 to energize the first coil 844a to produce the current I. Similar to FIGS. 5a-5b, the first magnet 82a and the first electromagnet 84a repulse each other and produce the first repulsive force. Since an attractive force exists between an iron and a permanent magnet, the second magnet 82b and the second iron core 842b attract each other and produce a second attracting force with the same direction as the first repulsive force, to drive the cover 70 to slide from the first room 620c to the second room 620d more quickly driven by the first repulsive force and the second attracting force. Therefore, the cover 70 slides from the first room 620c to the second room 620d to expose the power outlets 610, and at this time, the location of the housing 60 is defined as the first predetermined location of the housing 60. Thus, the state of the cover 70 is switched from the state shown in FIG. 6a to the state shown in FIG. 6b.

Then, when the switch 640 is pressed again to power off the power supply socket 1 to de-energize the first coil 844a and to energize the second coil 844b to produce the current I, and the second iron core 842b becomes a magnet. The reserve power resource 40 supplies power to the second electromagnet 84b. Thus, the first iron core 842a is de-magnetized and back to an iron. The second iron core 842b is magnetized to become a magnet and has a contrary magnetic polarity with the second magnet 82b, and one end of the magnetized second iron core 842b adjacent to the second magnet 82b is magnetized to be determined as a N pole according to the Ampere's Right Hand Rule.

Thus, the first attracting force is produced by the first magnet 82a and the first electromagnet 84a. At this time, the second magnet 82b and the magnetized second iron core 842b repulse each other and produce a second repulsive force, and the second repulsive force has the same direction with the first attracting force. Under driven of the first attracting force and the second repulsive force, the cover 70 slides over to the first room 620c from the second room 620d and is latched in the first room 620c, and at this time the location of the housing 60 is defined as the second predetermined location of the housing 60. At last, the state of the cover 70 is switched from the state shown in FIG. 6b to the state shown in FIG. 6c.

When the cover 70 slides to the state shown in FIG. 6c, the reserve power source 40 stops supplying power to the second electromagnet 84b, to de-energize the second coil 844b. Thus, each of the cover 70, the first and the second electromagnets 84a, 84b goes back to their initial state, and the power supply socket 1 returns to its initial state shown in FIG. 6a.

In another embodiment, each sliding mechanism 80 further includes an elastic part 86 (shown in FIG. 3). The elastic part 86 is disposed between the housing 60 and each cover 70. The elastic part 86 is deformed when the cover 70 moves away from the first iron core 842a, and recovers its deformation when the cover 70 moves towards the first iron core 842a to drive each cover 70 to slide more quickly relative to the housing 60.

Further referring to FIG. 3, a first protrusion 740 protrudes from the surface of each cover 70 adjacent to the sliding groove 730. Correspondingly, a protrusion (not shown) protrudes from the bottom of each receiving room 620, one end of the elastic part 86 is disposed on the corresponding first protrusion 740, and the other end is disposed on the corresponding protrusion of the housing 60. In addition, the housing 60 further includes at least one sliding part (not shown). The cover 70 can slide back and forth in the receiving room 620 along the at least one sliding part to cover or expose the power outlets 610. In another embodiment, the receiving room 620 of the housing 60 can be omitted, the power outlets 610 are disposed on the surface of the housing 60, and the cover 70 slides on the surface of the housing 60 to work at different states.

FIG. 3 show that the power supply socket 1 further includes at least one fixing member 90. The at least one fixing member 90 is located in the corresponding second room 620d of the housing 60, and has the same dimensions as that of the corresponding second room 620d. Thus, the bottom wall of each fixing member 90 resists the corresponding connecting surface 620e, so that the cover 70 can slide on the fixing member 90 smoothly. Each sliding mechanism 80 further includes the elastic part 86 located between each cover 70 and a corresponding fixing member 90.

Each elastic part 86 is a torsional spring. Each fixing member 90 includes a square main body 910 and two sliding parts 920 extending outward from the two opposite sidewalls of the main body 910. The two sliding parts 920 are received in the sliding groove 730 of the cover 70 and also can slide in the sliding groove 730. A second protrusion 9101 protrudes from a surface of the main body 910 adjacent to the cover 70, and two ends of each elastic part 86 are respectively disposed on the first protrusion 740 and the second protrusion 9101. At least two through holes 650 are defined at the bottom of each second room 620d of the housing 60 and at least two locating parts 9103 protrude from the surface of each main body 910 away from the cover 70. The at least two locating parts 9103 are facing the at least two through holes 650. The at least two locating parts 9103 can respectively pass through the at least two through holes 650 by a screw to fix the fixing member 90 in the housing 60. In other embodiment, each fixing member 90 may adhere in the housing 60.

Figure 7:
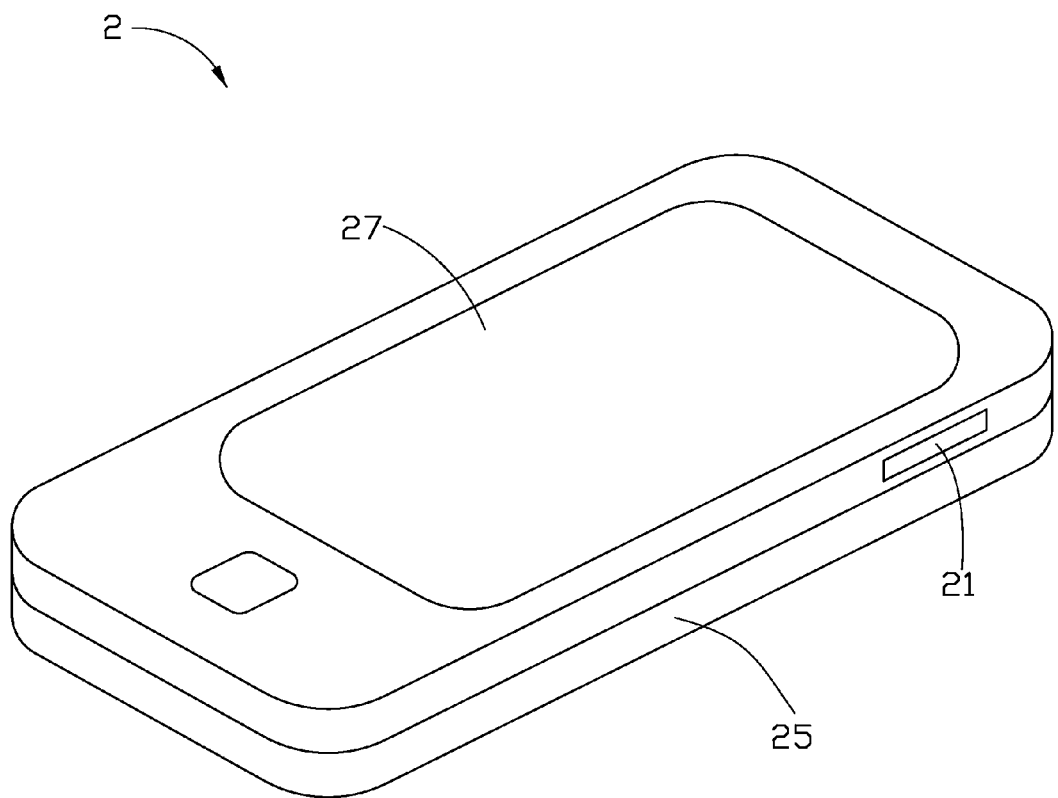
FIG. 7 is an isometric view of an electronic apparatus in a closed state, according to a second embodiment.
Figure 8:
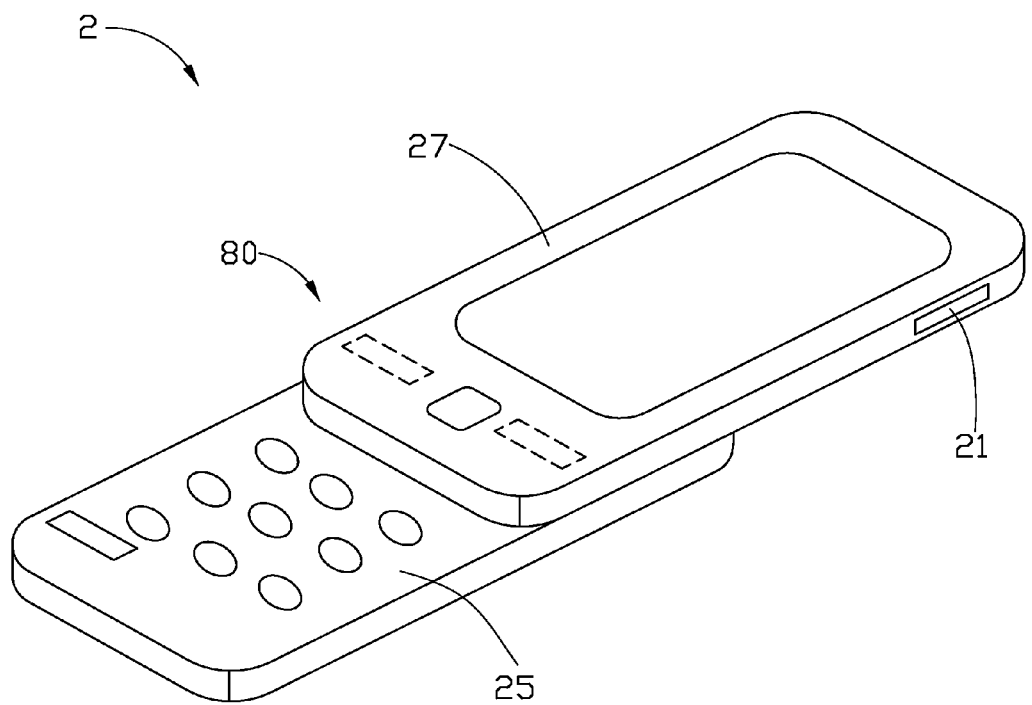
FIG. 8 is an isometric view of the electronic apparatus of FIG. 7 in an expanded state.
Figure 9:
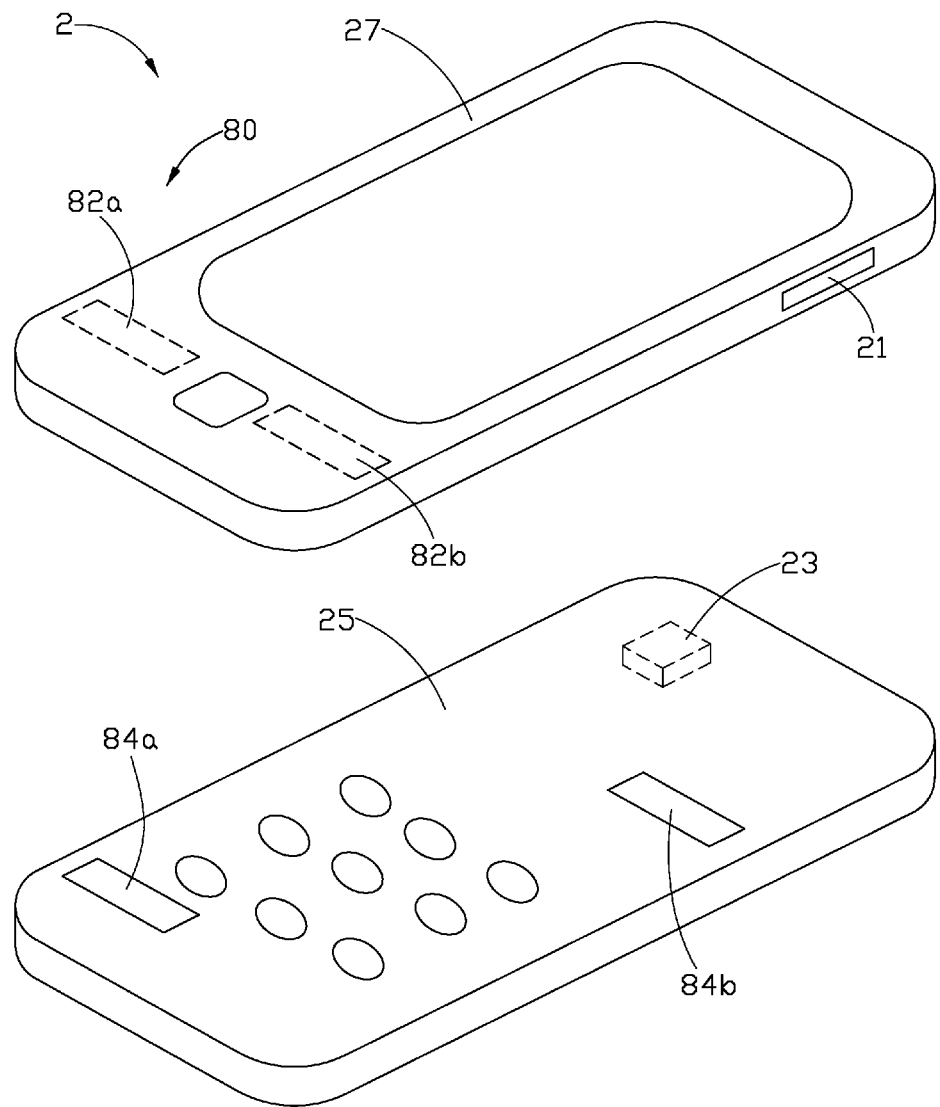
FIG. 9 is an exploded view of the electronic apparatus of FIG. 7.

FIGS. 7-9 show another embodiment of the electronic apparatus, in this embodiment, a mobile phone 2 is taken as an example of the electronic apparatus. FIG. 7 shows an isometric view of the mobile phone 2 in a closed state, and FIG. 8 shows an isometric view of the mobile phone 2 in an expanded state. The mobile phone 2 includes an upper housing 27, a lower housing 25 and a sliding mechanism 80. The lower housing 25 is defined as the base, the upper housing 27 is defined as the sliding member, and the upper housing 27 slides back and forth relative to the lower housing 25 under the drive of the sliding mechanism 80.

As shown in FIG. 9, the sliding mechanism 80 includes the first magnet 82a and the first electromagnet 84a. The first magnet 82a is located at a bottom surface of the upper housing 27, one end of the first magnet 82a adjacent to the surface is defined as the N pole of the first magnet 82a, and another end of the first magnet 82a away from the surface is defined as the S pole of the first magnet 82a. The first electromagnet 84a is located opposite to the first magnet 82a when the mobile phone 2 is in the closed state. Similar to FIGS. 5a-5b, the upper housing 27 of the mobile phone 2 can slide back and forth driven by the first magnet 82a and the first electromagnet 84a, so as to alternatively work in the expanded state and the closed state.

Accordingly, the sliding mechanism 80 further includes the second magnet 82b and the second electromagnet 84b. The second magnet 82b is located at the bottom surface of the upper housing 27 parallel to the first magnet 82a, one end of the second magnet 82b adjacent to the surface is defined as the N pole of the second magnet 82b, and another end of the second magnet 82b away from the surface is defined as the S pole of the second magnet 82b. The second electromagnet 84b is located opposite to the second magnet 82b when the mobile phone 2 is in the expanded state. Similar to FIGS. 6a-6c, the upper housing 27 of the mobile phone 2 can slide back and forth driven by the first and the second magnets 82a, 82b and the first and the second electromagnets 84a, 84b, to alternatively work in the expanded state and the closed state.

The mobile phone 2 further includes a switch button 21 and a power module 23. The switch button 21 triggers the mobile phone 2 to energize and de-energize the first coil 844a of the first electromagnets 84a or the second coil 844b of the second electromagnets 84b. The power module 23 supplies power for the first and the second electromagnets 84a, 84b.

In other embodiments, the base and the sliding member do not overlap with each other, they are arranged in a same plane and parallel to each other.

According to the above descriptions of the present disclosure, the sliding member can automatically slide relative to the base. Thus, the electronic apparatus having the sliding mechanism can be more conveniently used by the user.

Although the present disclosure has been specifically described on the basis of the exemplary embodiment thereof, the disclosure is not to be construed as being limited thereto. Various changes or modifications may be made to the embodiment without departing from the scope and spirit of the disclosure.

What is claimed is:

1. A sliding mechanism for driving a sliding member to slide back and forth between different locations of a base, the sliding mechanism comprising:
    a first magnet disposed in the sliding member; and
    a first electromagnet disposed in the base opposite to the first magnet, and the first electromagnet comprising a first iron core and a first coil wound around the first iron core;
    wherein when the first coil is to be energized, the first iron core is magnetized by the first coil and has a contrary magnetic polarity with the first magnet, the first magnet and
    the first iron core repulse each other and produce a first repulsive force to drive the first magnet to move away from the first iron core; when the first coil is to be de-energized,
    the first iron core is magnetized by the first magnet, the first magnet and the first iron core attract each other and produce a first attracting force to attract the first magnet to move towards the first iron core; the sliding member alternately slides back and forth between the different locations of the base driven by the first repulsive force and the first attracting force;
    a second magnet disposed in the sliding member and symmetrically arranged with the first magnet; and
    a second electromagnet disposed in the base opposite to the second magnet, and the second electromagnet comprising a second iron core and a second coil wound around the second iron core;
    wherein when the first coil is to be energized, the second coil is to be de-energized,
    the second iron core is magnetized by the second magnet, the second magnet and the second iron core attract each other and produce a second attracting force having the same direction as the first repulsive force to attract the second magnet to move towards the second iron core, and the sliding member is driven by the first repulsive force and the second attracting force to slide to a first predetermined location of the base; when the first coil is to be de-energized, the second coil is to be energized, the second iron core is magnetized by the second coil and has a contrary magnetic polarity with the second magnet, the second magnet and the second iron core repulse each other and produce a second repulsive force having the same direction as the first attracting force to drive the second magnet to move away from the second iron core, and the sliding member is driven by the first attracting force and the second repulsive force to slide to a second predetermined location of the base.

2. The sliding mechanism as recited in claim 1, further comprising an elastic part disposed between the base and the sliding member, the elastic part is deformed when the first magnet moves away from the first iron core, and the elastic part recovers its deformation when the first magnet moves towards the first iron core to drive the sliding member to slide in the base.

3. The sliding mechanism as recited in claim 1, wherein the first magnet and the second magnet are permanent magnets; one end of the first magnet adjacent to the first iron core is a S pole, and one end of the first iron core adjacent to the first magnet is magnetized to a S pole when the first coil is to be energized, thereby producing the first repulsive force between the first magnet and the first iron core; one end of the second magnet adjacent to the second iron core is a N pole, and one end of the second iron core adjacent to the second magnet is magnetized to a N pole when the second coil is to be energized, thereby producing the second repulsive force between the second magnet and the second iron core.

4. The sliding mechanism as recited in claim 1, wherein the first magnet and the second magnet are permanent magnets; one end of the first magnet adjacent to the first iron core is a S pole, and one end of the first iron core adjacent to the first magnet is magnetized to a S pole when the first coil is to be energized, thereby producing the first repulsive force between the first magnet and the first iron core; one end of the second magnet adjacent to the second iron core is a S pole, and one end of the second iron core adjacent to the second magnet is magnetized to a S pole when the second coil is to be energized, thereby producing the second repulsive force between the second magnet and the second iron core.

5. The sliding mechanism as recited in claim 1, wherein the sliding member is a permanent magnet, and the first magnet and the second magnet are respectively a S pole and a N pole of the sliding member; one end of the first iron core adjacent to the first magnet is magnetized to a S pole when the first coil is to be energized, thereby producing the first repulsive force between the first magnet and the first iron core; one end of the second iron core adjacent to the second magnet is magnetized to a N pole when the second coil is to be energized, thereby producing the second repulsive force between the second magnet and the second iron core.

6. An electronic apparatus comprising a base, at least one sliding member, at least one sliding mechanism and a switch, the at least one sliding member being disposed in the base and sliding back and forth between different locations of the base driven by the at least one sliding mechanism, each sliding mechanism comprising:
    a first magnet disposed in one sliding member; and
    a first electromagnet disposed in the base opposite to the first magnet, and the first electromagnet comprising a first iron core and a first coil wound around the first iron core;
    wherein pressing the switch is to energize or de-energize the first coil; when the first coil is to be energized, the first iron core is magnetized by the first coil and has a contrary magnetic polarity with the first magnet, the first magnet and the first iron core repulse each other and produce a first repulsive force to drive the first magnet to move away from the first iron core; when the first coil is to be de-energized, the first iron core is magnetized by the first magnet, the first magnet and the first iron core attract each other and produce a first attracting force to attract the first magnet to move towards the first iron core; the at least one sliding member alternately slides back and forth between the different locations of the base under the drive of the first repulsive force and the first attracting force;

a second magnet disposed in one sliding member and symmetrically arranged with the first magnet; and a second electromagnet disposed in the base opposite to the second magnet, the second electromagnet comprising a second iron core and a second coil wound around the second iron core;

wherein pressing the switch is further to energize and de-energize the second coil;

when the first coil is to be energized, the second coil is to be de-energized, the second iron core is magnetized by the second magnet, the second magnet and the second iron core attract each other and produce a second attracting force having the same direction as the first repulsive force to attract the second magnet to move towards the second iron core, and the at least one sliding member is driven by the first repulsive force and the second attracting force to slide to a first predetermined location of the base; when the first coil is to be de-energized, the second coil is to be energized, the second iron core is magnetized by the second coil and has a contrary magnetic polarity with the second magnet, the second magnet and the second iron core repulse each other and produce a second repulsive force having the same direction as the first attracting force to drive the second magnet to move away from the second iron core, and the at least one sliding member is driven by the first attracting force and the second repulsive force to slide to a second predetermined location of the base.

7. The electronic apparatus as recited in claim 6, wherein each sliding mechanism further comprises an elastic part disposed between the base and one sliding member, the elastic part is deformed when the first magnet moves away from the first iron core, and the elastic part recovers its deformation when the first magnet moves towards the first iron core to drive one sliding member to slide in the base.

8. The electronic apparatus as recited in claim 6, wherein the electronic apparatus is a power supply socket; the numbers of the sliding member and the sliding mechanism are both three, the base defines three receiving rooms correspondingly, a pair of power outlets is disposed in the bottom of each receiving room; each sliding member is disposed in each receiving room correspondingly and slides back and forth between the different locations of the corresponding receiving room driven by each sliding mechanism to alternately cover and expose the pair of power outlets respectively.

9. The electronic apparatus as recited in claim 6, wherein the electronic apparatus is a power supply socket; the numbers of the sliding member and the sliding mechanism are both three, the base defines a receiving room, three pairs of power outlets are disposed in the bottom of the receiving room; the three sliding members are arranged in the receiving room and slide back and forth between the different locations of the receiving room driven by the three sliding mechanisms correspondingly to alternately cover and expose the three pairs of power outlets respectively.

10. The electronic apparatus as recited in claim 8, wherein two receiving grooves extend inward from two opposite sidewalls of each receiving room perpendicular to the sliding direction of each sliding member correspondingly, and the two receiving grooves are configured to receive the first and the second magnets; two sidewalls of each receiving room perpendicular to the sliding direction of each sliding member define two notches for receiving the first and the second electromagnets, respectively.

11. The electronic apparatus as recited in claim 8, wherein each sliding member is a permanent magnet, and the first magnet and the second magnet are respectively a S pole and a N pole of each sliding member, two sidewalls of each receiving room perpendicular to the sliding direction of each sliding member define two notches, and the two notches are configured to receive the first and the second electromagnets.

12. The electronic apparatus as recited in claim 8, wherein the power supply socket further comprises three fixing members, each receiving room further comprises a first room and a second room lower than the first room and communicating with the first room; each fixing member is received in one second room, each pair of power outlets is defined in the bottom of each first room; each sliding member is disposed above one fixing member correspondingly, and slides relative to the fixing member between the first room and the second room.

13. The electronic apparatus as recited in claim 12, each sliding member further comprises a sliding groove, each fixing member comprises two sliding parts, the two sliding parts are received and slide in the sliding groove.

14. The electronic apparatus as recited in claim 13, wherein the power supply socket further comprises a reserve power source, the reserve power source supplies power to the first electromagnet and/or the second electromagnet when the power supply socket is powered off.

15. The electronic apparatus as recited in claim 6, wherein the electronic apparatus is a mobile phone, the first and the second magnets are symmetrically arranged in a bottom surface of the sliding member; the first electromagnet is opposite to the first magnet when the mobile phone is in a closed state, the second electromagnet is opposite to the second magnet when the mobile phone is in an expanded state.

16. The electronic apparatus as recited in claim 15, wherein one end of the first or the second magnet adjacent to the surface is defined as a N pole of the first or the second magnet, and another end of the first or the second magnet away from the surface is defined as a S pole of the first or the second magnet.

17. The electronic apparatus as recited in claim 16, wherein the mobile phone further comprises a power module, the power module supplies power to the first or the second electromagnet.

* * * * *